United States Patent [19]

Anderson

[11] Patent Number: 4,630,006
[45] Date of Patent: Dec. 16, 1986

[54] CURRENT-TUNED TRANSISTOR OSCILLATOR

[76] Inventor: Keith V. Anderson, P.O. Box 800, Black Hawk, S. Dak. 57718

[21] Appl. No.: 739,613

[22] Filed: May 31, 1985

[51] Int. Cl.$^4$ ............................................. H03B 5/12
[52] U.S. Cl. ............................. 331/117 R; 331/177 R
[58] Field of Search ........... 331/117 R, 177 R, 177 V, 331/36 C, 116 R; 332/16 T, 30 R, 30 V

[56] References Cited

U.S. PATENT DOCUMENTS

| | | | |
|---|---|---|---|
| 3,076,945 | 2/1963 | Coombs | 331/177 R X |
| 3,089,040 | 5/1963 | Hovey . | |
| 3,403,354 | 9/1968 | Harwood | 332/19 |
| 3,550,037 | 12/1970 | Wiencek | 331/116 R |
| 3,611,195 | 10/1971 | Parham | 331/117 R X |
| 3,728,645 | 4/1973 | Rosen et al. | 331/36 C X |
| 3,879,677 | 4/1975 | Arnold | 331/77 |
| 4,010,428 | 3/1977 | Sunkler | 331/117 R |
| 4,034,312 | 7/1977 | Armand | 331/96 |
| 4,047,126 | 9/1977 | Anderson | 331/96 |
| 4,075,580 | 2/1978 | Sunkler | 331/96 |
| 4,096,453 | 6/1978 | Rogers | 331/117 D |
| 4,150,344 | 4/1979 | Fenk | 331/117 D |

OTHER PUBLICATIONS

"The Voltage-Variable-Capacitance-Diode", from *Workshop in Solid State*, by Harold E. Ennes, pp. 41–44.

*Primary Examiner*—Siegfried H. Grimm
*Attorney, Agent, or Firm*—Dorsey & Whitney

[57] ABSTRACT

A simplified current-tuned bipolar junction transistor oscillator is provided that is especially adapted for low power applications. The oscillator hereof utilizes the diffusion capacitance of the transistor's forward-biased base-emitter junction together with an inductance connected directly across the transistor's base-collector junction as reactive elements in the oscillator's frequency determining network. The transistor's base-collector junction is operated at zero volts bias thereby insuring that its depletion capacitance is fixed. The input current to the emitter is varied to change the base-emitter diffusion capacitance thereby adjusting the oscillator's frequency of oscillation.

23 Claims, 2 Drawing Figures

CURRENT-TUNED TRANSISTOR OSCILLATOR

TECHNICAL FIELD

This invention relates to solid state oscillators which provide a sinusoidal output at a relatively low power level. In particular, it relates to a bipolar junction transistor (BJT) oscillator whose output frequency is electrically tunable.

BACKGROUND ART

Low power solid state oscillators are widely employed in electronic systems used in such diverse fields as communications, control and instrumentation. In many of these systems, the frequency of oscillation is required to be electrically controllable. Examples of such applications are the common automatic frequency control (AFC) circuit of an FM receiver and the ubiquitous phase-locked loop (PLL) circuit found in FM demodulators, frequency synthesizers, and countless other electronic systems.

BJTs have frequently been used in electrically tuned oscillators as the active (i.e., gain producing) element. Such circuits have generally obtained electical control of the oscillation frequency by employing a reverse-biased pn junction as a capacitive element in an LC tank circuit. This reverse-biased pn junction may simply be the base-collector junction of the BJT itself, or it may be a separate reverse-biased diode known as a "varactor". Some circuits utilize both a varactor diode and the BJT's base-collector junction in parallel in the frequency determining network.

Increasing the voltage across a reverse-biased pn junction causes the junction's depletion region (a narrow region near the junction that is devoid of mobile charge carriers) to widen. This widening, in turn, results in a decrease in the capacitance of the junction; the so-called junction depletion capacitance. Oscillator circuits that rely upon variations in junction depletion capacitance to vary oscillation frequency are inherently voltage controlled oscillator (VCO) circuits. Further, they are characterized by having a positive frequency-voltage characteristic; that is, an increase in junction bias voltage results in a corresponding increase in the frequency of oscillation. Since depletion capacitance is a nonlinear function of junction voltage however, such VCO circuits have highly nonlinear frequency-voltage characteristics. In addition, they may require relatively complex biasing networks.

SUMMARY OF THE INVENTION

The simplified current-tuned oscillator in accordance with the present invention makes use of the diffusion capacitance of the forward-biased base-emitter junction of an active BJT in conjunction with an inductive element to form a controllable frequency determining network. Diffusion capacitance, unlike depletion capacitance, is only present in forward-biased junctions. For a BJT operating in the forward-active mode, diffusion capacitance is associated with the base-emitter junction only. It is a manifestation of the charge of excess minority carriers stored in the neutral base region during forward-active operation and is directly proportional to the emitter bias current.

The oscillator circuit disclosed herein is unique in several respects. First of all, its oscillation frequency is current controlled rather than voltage controlled as in a conventional BJT VCO. Second, since diffusion capacitance is a linear function of emitter bias current, a relatively linear frequency-current relationship results. Third, since diffusion capacitance increases as bias current increases, this frequency-current characteristic has a negative slope. Fourth, although the BJT is actually biased in the forward-active region, its base-collector junction is operated at zero volts dc bias rather than at reverse bias as in a conventional BJT circuit. This results in considerable simplification of the circuitry and insures that the depletion capacitance of the base-collector junction does not vary.

The current-tuned oscillator hereof can be utilized in a variety of electronic applications due to its wide frequency range of oscillation, its linearity, its low power requirement, it stability, and its simplicity.

DETAILED DESCRIPTION

Figure 1:
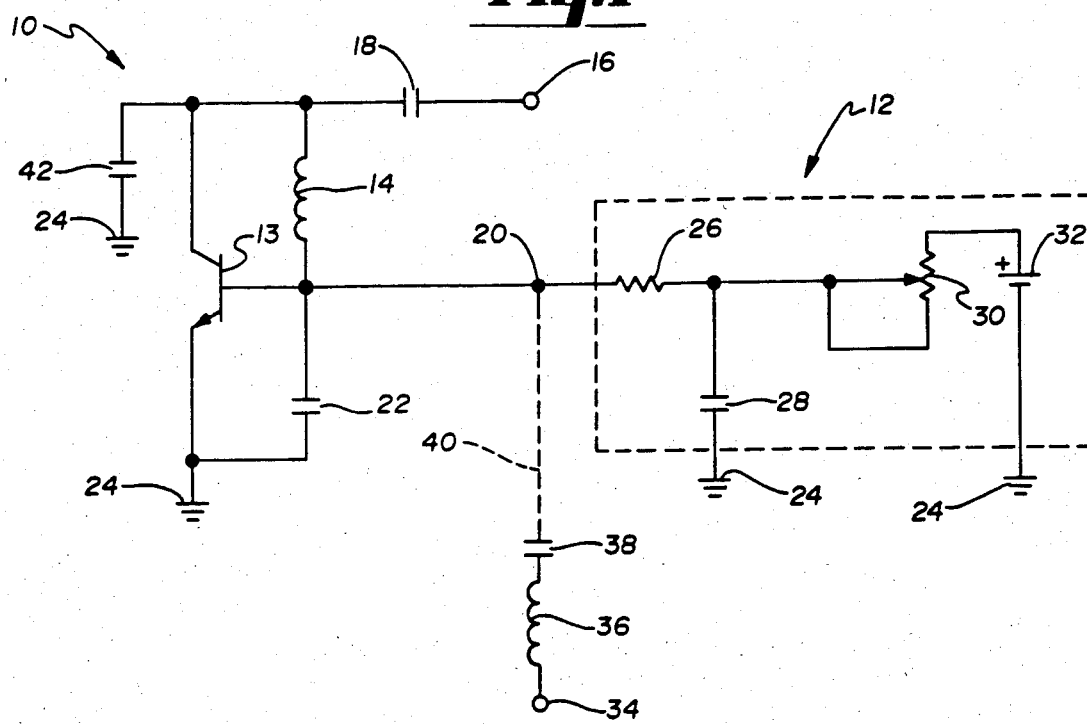
FIG. 1 is a schematic drawing of the simplified current-tuned oscillator in accordance with the present invention connected to a high-impedance variable bias-current source.

Referring to FIG. 1, a simple current-tuned oscillator 10 is shown in conjunction with a high-impedance variable bias-current source 12. The oscillator 10 includes bipolar junction transistor 13 and inductor 14. The oscillator 10 is connected to output terminal 16 by means of coupling capacitor 18. The power input terminal 20 of oscillator 10 is connected to the output of high-impedance variable bias-current source 12. An optional capacitor 22 extends between the base terminal of transistor 13 and ground 24. A second optional capacitor 42 extends between the collector terminal of transistor 13 and ground 24.

Transistor 13 comprises an NPN bipolar junction transistor. In particular, a type 2N3904 transistor manufactured by the Motorola Company of Phoenix, Ariz. has been found to provide excellent results in the frequency range of from about 10 MHz to 200 MHz. Although an NPN transistor is depicted in FIG. 1, a PNP bipolar junction transistor would serve equally well if the polarity of the dc power supply were reversed.

The base and collector terminals of transistor 13 are connected together by inductor 14. For oscillation at a nominal frequency of 10 MHz, inductor 14 is preferably valued at approximately 6.8 microhenries. It is understood, however, that different inductance values may be used to obtain different nominal oscillation frequencies. As will be appreciated by those skilled in the art, the inductor 14 acts as a dc short circuit between the base and collector of transistor 13 thus insuring that the base-collector function operates at zero volts bias.

Optional capacitor 42 can be added between the collector terminal of transistor 13 and ground 24 to increase feedback in the unlikely event that stray circuit capacitance is insufficient to produce oscillation. Such a capacitor may have a value in the range of 10 picofarads. Optional capacitor 22 can be added between the base terminal of transistor 13 and ground 24 to lower the frequency of oscillation. For example, a value of 47 picofarads will reduce the nominal oscillation frequency from about 10 MHz to about 6 MHz. The addition of capacitor 22, however, reduces the range of tuning that can be obtained under electrical control.

Although the circuit values disclosed are appropriate for an oscillator having output in the range of 10 MHz, it will be obvious to one skilled in the art that the oscillation frequency can be made lower or higher over a wide frequency range by suitably changing component values.

Capacitor 18 is a coupling capacitor for coupling the oscillator 10 to a frequency mixer, or other load requiring an oscillating input. Those skilled in the art will realize that coupling of oscillator 10 to its driven load could be accomplished in a variety of ways such as, for example, loop coupling to inductor 14 or capacitive coupling to the base terminal of transistor 13.

The oscillation frequency of oscillator 10 varies as a function of the dc emitter current of transistor 13. Since the base and collector of transistor 13 are connected together as far as dc is concerned, a bias-current source may be connected between the emitter terminal and either the base terminal or the collector terminal of transistor 13. FIG. 1 illustrates a variable bias-current source 12 connected between the emitter and base terminals of transistor 13. Variable bias-current source 12 can alternatively be connected between emitter and collector terminals of transistor 13.

Variable bias-current source 12 includes current limiting resistor 26, bypass capacitor 28 and variable resistor 30. Variable resistor 30 is connected to the positive terminal of a 12 volt dc power supply 32. The negative terminal of dc power supply 32 is connected to ground 24 and hence to the emitter terminal of transistor 13.

Resistor 26 provides a high source impedance for variable base-current source 12 and establishes the minimum oscillation frequency of oscillator 10 by setting an upper limit to the emitter current of transistor 13. The bypass capacitor 28 filters radio frequency signals to ground thereby isolating oscillator 10 from dc power supply 32. Its value is not critical and may be in the range of 0.01 microfarads. The variable bias-current source 12 provides a dc current ranging from about 4.0 to 7.7 milliamps when resistor 26 has value 1,500 ohms and variable resistor 30 has a maximum value of 2,000 ohms.

Bipolar junction transistor 13 comprises the amplifying element of oscillator 10. Although its base-collector junction is operated at zero bias voltage, it functions in the forward-active region; albeit very close to the saturation edge. Inductor 14, along with the total capacitance from collector to ground 24 and the total capacitance from base to ground 24, comprise a tuned feedback network coupling a fraction of the BJT's output signal back to its input. Because of the reactive elements in this network, its phase shift will be precisely 180 degrees at a single frequency—the frequency of oscillation. The capacitance from base to ground is dominated by the diffusion capacitance of the forward-biased base-emitter junction. Diffusion capacitance is a manifestation of minority carrier charge storage in the neutral base region and is directly proportional to emitter current. Hence, the frequency at which oscillator 10 oscillates can be controlled by varying the dc current supplied to the emitter by variable bias-current source 12.

Figure 2:
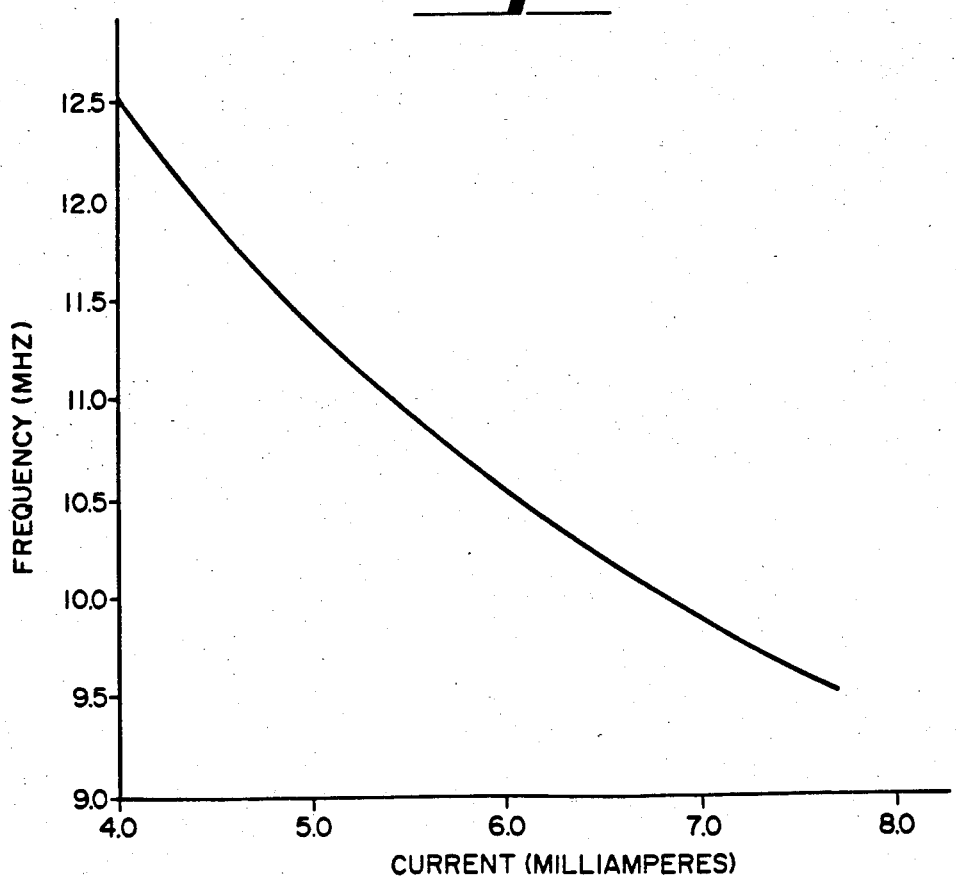
FIG. 2 is a graphical plot of oscillator output frequency as a function of emitter bias current.

FIG. 2 plots the output frequency presented at terminal 16, as a function of the current presented at oscillator input terminal 20. As can be seen from the graph, input current variance from 4.0 to 7.7 milliamps provides an output frequency varying from 12.5 megahertz to 9.5 megahertz. Moreover, it will be seen that the frequency versus current characteristic is approximately linear.

In the data presented in FIG. 2, the bias current supplied to the base-emitter junction of transistor 13 is held constant at each data point. Accordingly, the output of oscillator 10 is a sinusoidal signal of constant frequency. It should be understood, however, that the invention is not restricted to such simple applications. Advantages can often be gained by biasing the base-emitter junction with a time-varying signal from a high impedance source.

For example, the invention can be used as a frequency converter by presenting a sinsoidally varying input signal to oscillator input terminal 20 in addition to the dc bias current provided by bias-current source 12. Referring to FIG. 1, the sinusoidally varying input signal can be introduced at terminal 34 and conducted to input terminal 20 through choke 36, coupling capacitor 38 and lead 40. The output signal will then comprise the oscillator frequency as established by the dc bias current along with additional modulation products at the oscillator frequency plus and minus an integer times the frequency of the sinusoidally varying input signal.

I claim:

1. A current-tuned electronic oscillating circuit, comprising:
    a bipolar junction transistor having a base-emitter pn junction and a base-collector pn junction, and base, collector and emitter terminals;
    means operably coupled to said transistor for biasing said transistor to operate in the forward-active region, said biasing means comprising a current source, whereby bias current is provided through said base-emitter pn junction in the forward direction presenting diffusion capacitance across said base-emitter pn junction, said biasing means further operably coupling said current source to said collector terminal presenting a collector bias voltage at said collector terminal and a zero bias voltage across said base-collector pn junction, said collector bias voltage established solely by said current source;
    reactive feedback means operably coupling said collector and base terminals for transmitting a phase shifted feedback signal from said collector terminal to said base terminal, thereby causing said oscillating circuit to oscillate at a nominal frequency determined by said reactive feedback means in conjunction with said diffusion capacitance; and
    means operably connected to said current source biasing means for selectively varying said bias current, whereby said diffusion capacitance is selectively varied in response to said varying bias current to selectively alter said nominal oscillating frequency.

2. A circuit as claimed in claim 1, wherein said feedback means comprises an inductive element.

3. A circuit as claimed in claim 1, said means for selectively varying said bias current comprising a direct current power supply operably coupled to a variable resistor.

4. A circuit as claimed in claim 1, said means for selectively varying said bias current including a direct current power supply and a time varying signal source.

5. A circuit as claimed in claim 1, including a capacitive element operably coupled to said collector terminal and said emitter terminal for providing a signal feedback path therebetween.

6. A circuit as claimed in claim 1, including a capacitive element operably coupled to said base terminal and said emitter terminal for determining said nominal frequency in conjunction with said reactive feedback means and said diffusion capacitance.

7. An electonic circuit for generating an oscillating signal, comprising:
  a bipolar junction transistor having a base-emitter pn junction and a base-collector junction, and base, collector, and emitter terminals;
  an inductive element operably coupled between said base and collector terminals whereby an ac reactive feedback path and a dc short circuit is presented across said base-collector pn junction; and
  a high impedance power source operably coupled to said base terminal and coupled to said collector terminal through said inductive element, for operating said transistor in the forward-active region, said power source presenting biasing energy for establishing a collector bias voltage and a base bias voltage, said dc short circuit establishing a zero bias voltage across said base-collector junction, said collector bias voltage determined solely by said coupling of said collector terminal to said power source through said inductive element.

8. A circuit as claimed in claim 7, including a capacitive element operably coupled to said collector terminal and said emitter terminal for providing a signal feedback path therebetween.

9. A circuit as claimed in claim 7, said oscillating signal varying at a nominal frequency, said circuit including a capacitive element operably connected between said base terminal and said emitter terminal for determining said nominal frequency.

10. An electronic oscillating circuit comprising:
  a bipolar junction transistor having a base-collector pn junction, a base-emitter pn junction, and collector, emitter, and base terminals;
  an inductive element operably coupled to said collector terminal and said base terminal presenting a reactive ac feedback path and a dc short circuit between said collector terminal and said base terminal;
  power means operably coupled to said base terminal and connected to said collector terminal through said inductive element, said power means presenting biasing energy for establishing a collector bias voltage and a base bias voltage, said collector bias voltage determined solely by said coupling of said collector terminal to said power source through said inductive element, said power means providing diffusion capacitance across said base-emitter pn junction, and an output signal from said transistor,
  said diffusion capacitance and said inductive element comprising a tuned load and feedback path for said transistor, whereby said output signal oscillates at an operating frequency determined by said diffusion capacitance and said inductive element.

11. A circuit as claimed in claim 10, said power means comprising means for establishing a dc bias current through said base-emitter pn junction for establishing the value of said diffusion capacitance, said circuit including means operably coupled to said power source for varying the value of said bias current, thereby altering the value of said diffusion capacitance and said operating frequency.

12. A circuit as claimed in claim 10, including a capacitive element operably coupled between said collector terminal and said emitter terminal for providing a feedback path therebetween.

13. A circuit as claimed in claim 10, including a capacitive element operably connected between said base terminal and said emitter terminal for determining said operating frequency in conjunction with said diffusion capacitance and said inductive element.

14. A current-tuned oscillator circuit comprising:
  a bipolar junction transistor having base-emitter and base-collector pn junctions and having base, collector, and emitter terminals;
  means operably coupled to said transistor for biasing said transistor to operate in the forward-active region, said biasing means comprising a current source, whereby bias current is provided through said base-emitter pn junction in the forward direction presenting diffusion capacitance across said base-emitter pn junction, said biasing means further operably coupling said current source to said collector terminal for presenting a collector bias voltage at said collector terminal and a zero bias voltage across said base-collector pn junction, said collector bias voltage established solely by said current source;
  reactive network means for coupling a signal from said collector terminal to said base terminal, said coupled signal being shifted 180 degrees in phase at an oscillation frequency determined by said diffusion capacitance; and
  means for varying said diffusion capacitance by varying said bias current through said base-emitter pn junction.

15. A current-tuned oscillator circuit as claimed in claim 14 wherein said means for providing a collector bias voltage and said reactive network means comprise an inductor connected between said base terminal and said collector terminal.

16. A current-tuned oscillator circuit as claimed in claim 14 wherein said means for providing a bias current through said base-emitter pn junction includes a direct current power supply and wherein said means for varying said diffusion capacitance by varying said bias current includes a variable resistor.

17. A current-tuned oscillator circuit as claimed in claim 14 wherein said means for providing a bias current through said base-emitter pn junction and said means for varying said diffusion capacitance by varying said bias current include a time-varying signal source.

18. An electronic oscillating circuit comprising:
  a bipolar junction transistor having base-emitter and base-collector pn junctions and having base, collector, and emitter terminals;
  an inductor connected directly between said base terminal and said collector terminal providing both an ac reactive feedback path and a dc short circuit across said base-collector pn junction; and
  a high impedance power source coupled to said base terminal and coupled to said collector terminal through said inductor, for operating said transistor in the forward-active region, said power source presenting biasing energy for establishing a collector bias voltage and a base bias voltage, said dc short circuit establishing a zero bias voltage across said base-collector junction, said collector bias voltage determined solely by said coupling of said collector terminal to said power source through said inductor.

19. An electronic oscillating circuit as claimed in claim 18 including a capacitor connected between said collector terminal and said emitter terminal.

20. An electronic oscillating circuit as claimed in claim 18 including a capacitor connected between said base terminal and said emitter terminal.

21. An electronic oscillating circuit as claimed in claim 18 wherein said high impedance power source includes a dc power supply.

22. An electronic oscillating circuit as claimed in claim 21 wherein said high impedance power source includes a variable resistance.

23. An electronic oscillating circuit as claimed in claim 18 wherein said high impedance power source includes a time varying signal source.

* * * * *